(12) United States Patent
Lung

(10) Patent No.: US 7,202,493 B2
(45) Date of Patent: Apr. 10, 2007

(54) CHALCOGENIDE MEMORY HAVING A SMALL ACTIVE REGION

(75) Inventor: Hsiang-Lan Lung, Hsinchu (TW)

(73) Assignee: Macronix International Co., Inc., Hsinchu (TW)

( * ) Notice: Subject to any disclaimer, the term of this patent is extended or adjusted under 35 U.S.C. 154(b) by 0 days.

(21) Appl. No.: 11/001,424

(22) Filed: Nov. 30, 2004

(65) Prior Publication Data

US 2006/0113521 A1    Jun. 1, 2006

(51) Int. Cl.
    *H01L 47/00* (2006.01)
(52) U.S. Cl. .................. 257/4; 257/2; 257/E31.029
(58) Field of Classification Search .............. 257/4, 257/50, 529, 530, 209, 2, 3, 5, E31.029; 438/600, 438/601, 131, 132
See application file for complete search history.

(56) References Cited

U.S. PATENT DOCUMENTS

| 6,031,287 A | 2/2000 | Harshfield |
| 6,111,264 A | 8/2000 | Wolstenholme et al. |
| 6,114,713 A | 9/2000 | Zahorik |
| 6,189,582 B1 * | 2/2001 | Reinberg et al. ............ 438/239 |
| 6,781,145 B2 * | 8/2004 | Doan et al. ..................... 257/3 |
| 6,795,338 B2 * | 9/2004 | Parkinson et al. .......... 365/163 |

* cited by examiner

*Primary Examiner*—Thomas Dickey
*Assistant Examiner*—Benjamin Tzu-Hung Liu
(74) *Attorney, Agent, or Firm*—Stout, Uxa, Buyan & Mullins, LLP

(57) ABSTRACT

A chalcogenide phase change memory cell has a substrate with a conductor line. The conductor line has a contact end. An insulating layer is located over the substrate and conductor line. An aperture is located in the insulating layer. The aperture extends to the substrate. A memory material is conformally located within the aperture. The memory material is in electrical contact with the contact end. A conductive layer is located over the memory material in the aperture.

15 Claims, 15 Drawing Sheets

CHALCOGENIDE MEMORY HAVING A SMALL ACTIVE REGION

BACKGROUND OF THE INVENTION

1. Field of the Invention

The present invention relates generally to memory devices and, more particularly, to a non-volatile chalcogenide memory device.

2. Description of Related Art

Integrated circuits, typically in the form of microprocessors, microcontrollers, or other logic circuits, are used to control the functions of many modern electronic devices. For example, integrated circuits are used to control the functions of computers, telephones, and many other consumer electronics. It is generally necessary for the integrated circuits to retrieve (read) and store (write) data as they perform their functions. The data may be in the form of instructions for the integrated circuits (e.g., a program), data necessary for the execution of a program, or data generated during the execution of the program. It is preferable to store the data in memory devices which are easily accessible by the integrated circuits.

Many different types of memory devices are known for the storage of data. In selecting a memory device, the particular requirements for the data with which the memory device will be used are important. For example, several parameters such as the quantity of data, the required access time and the required storage time can play an influential role in memory device selection.

Phase change memory is a type of memory that retains stored information after power has been removed from the memory device. This type of memory is called non-volatile memory. Phase change memory uses electrically writable and erasable phase change materials that can be electrically switched between an amorphous and a crystalline state or between different resistive states. Phase change memories have been fabricated using various materials such as chalcogenide. Chalcogenide can be made from a mixture of elements including, tellurium (Te), selenium (Se), antimony (Sb), nickel (Ni) and germanium (Ge).

Chalcogenide memory can be switched between several electrical states of varying resistivity in nanosecond time periods with the input of picojoules of energy. Chalcogenide is non-volatile and maintains the integrity of the information stored by the memory cell without the need for periodic refreshing by an electrical signal. Chalcogenide memory also retains the information in the memory cell when power is removed from the device. Chalcogenide memory can be directly overwritten without first having to erase the contents of the memory cell. Another advantage of chalcogenide memory is that it can be switched to more than two different states. Depending upon the amount of electrical energy that is passed through the memory device, the memory device can be changed from an amorphous state to a crystalline state or to varying states in between. Chalcogenide material changes conductivity or resistance based upon its crystal state. For example, in the amorphous state, chalcogenide shows a lower electrical conductivity than it does in its crystalline state.

Chalcogenide memories are switched between states by passing an appropriate current through an active region of chalcogenide between electrodes or contacts. The amount of power required to switch a memory cell is dependent upon the size of the active region. A small active region requires less power than a large active region. The size of the active region can be controlled by the size of the electrical contact or electrode.

Methods of fabricating and designs for chalcogenide memories are disclosed in U.S. Pat. No. 6,031,287 to Harshfield; U.S. Pat. No. 6,111,264 to Wolstenholme et al; and U.S. Pat. No. 6,114,713 to Zahorik, all of which are hereby incorporated by reference in their entireties. As set fourth in the prior art, a typical chalcogenide memory cell relies upon fabrication techniques that endeavor to limit the minimum dimensions of the active region. The minimum size of the active region is typically controlled by the limits of photolithography and conventional semiconductor processing technology. An important factor in reducing the required current is the size of the active region. Prior attempts at making smaller device features have attempted to deposit chalcogenide materials into ultra-small holes. Unfortunately, the small holes can be difficult to fabricate and fill, potentially resulting in poor yields during manufacturing.

Chalcogenide memories are not readily driven by CMOS circuitry due to the relatively high current requirements needed to change phases. Such prior art designs can consume an excessive amount of power in order to switch states, with the active regions of the prior art memory cells having been relatively large and difficult to fabricate.

A need exists in the prior art for a chalcogenide memory with reduced power consumption, higher density and smaller device feature sizes.

SUMMARY OF THE INVENTION

The present invention is directed to overcoming problems of the prior art. In particular, the present invention may provide a design and method for fabricating phase change memory cells with small dimensions which may be below the limits of current photolithography and reduce the required switching energy. The present invention discloses a phase change memory that can have relatively low power consumption and high storage density. The present invention further discloses a method of making a phase change memory having relatively small device features.

In accordance with one aspect of the present invention, a memory cell comprises a substrate with a conductor line. The conductor line has a contact end. An insulating layer can be disposed over the substrate and conductor line. An aperture can be disposed in the insulating layer. The aperture extends to the substrate. A memory material can be conformally disposed within the aperture. The memory material is in electrical contact with the contact end. A conductive layer can be disposed over the memory material in the aperture.

In accordance with another aspect of the present invention, a memory cell comprises a substrate having first and second via extending therethrough. An insulating layer can be disposed over the substrate. An aperture can be formed in the insulating layer. A memory layer can be formed in the aperture. The memory layer has a bottom surface and first and second side walls. The bottom surface contacts the substrate. First and second conductive lines can be located between the insulating layer and the substrate. The conductive lines can be connected between the memory layer and the via. A conductive layer can be located over the memory layer within the aperture.

In accordance with yet another aspect of the present invention, a memory cell comprises a substrate that has a conductor line disposed on the substrate. The conductor line has a first end and a second end. An insulating layer can be disposed over the substrate and conductor line. An aperture can be formed in the insulating layer. A phase change layer can be positioned within the aperture and in contact with the first end. A conductive layer covers the phase change layer and fills the aperture.

Any feature or combination of features described herein are included within the scope of the present invention provided that the features included in any such combination are not mutually inconsistent as will be apparent from the context, this specification, and the knowledge of one of ordinary skill in the art. For purposes of summarizing the present invention, certain aspects, advantages and novel features of the present invention are described herein. Of course, it is to be understood that not necessarily all such aspects, advantages or features will be embodied in any particular embodiment of the present invention. Additional advantages and aspects of the present invention are apparent in the following detailed description and claims.

DETAILED DESCRIPTION OF THE PRESENTLY PREFERRED EMBODIMENTS

Figure 1:
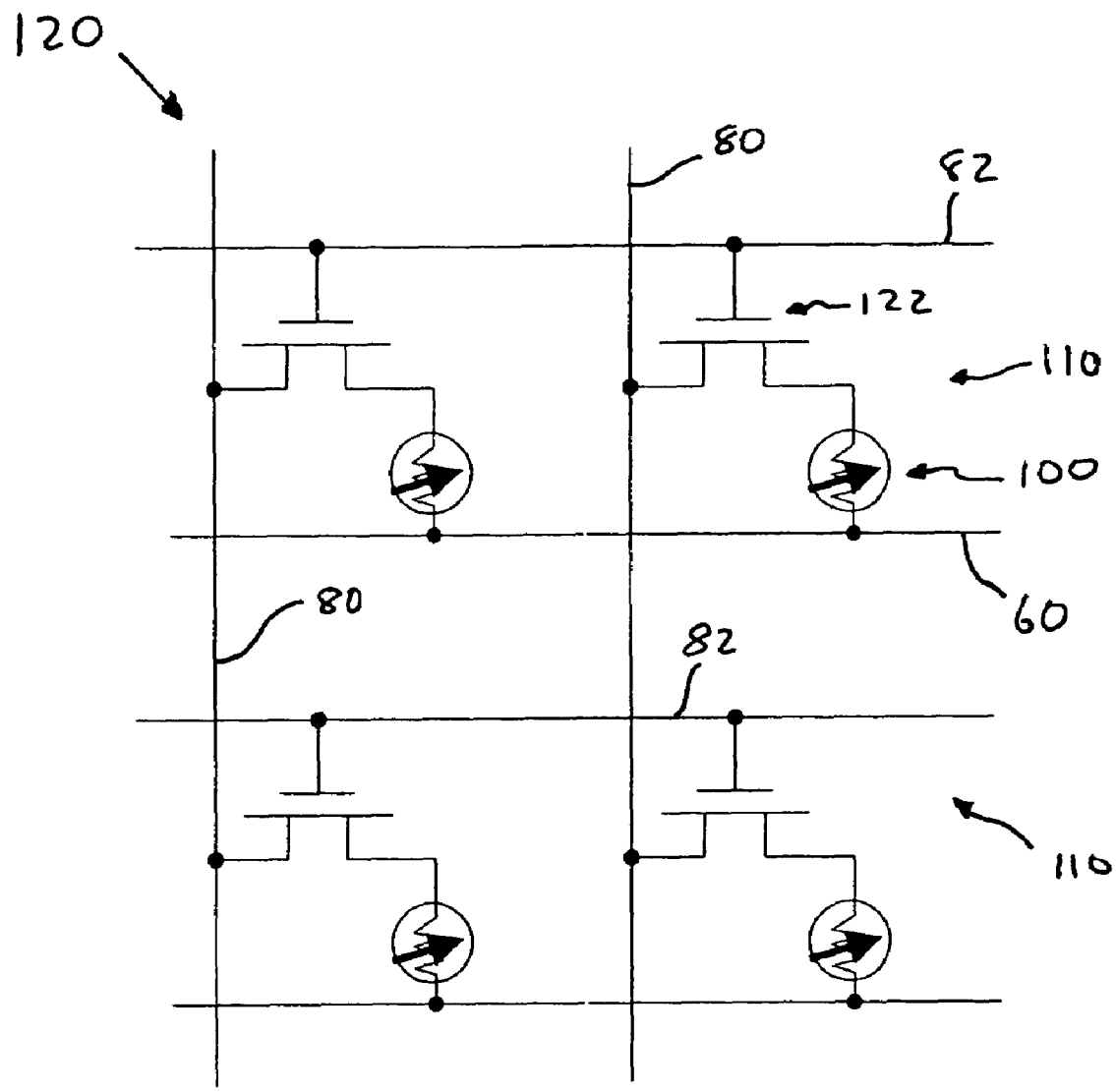
FIG. 1 is a schematic diagram of a memory array in accordance with the present invention.

Reference will now be made in detail to the presently preferred embodiments of the invention, examples of which are illustrated in the accompanying drawings. Wherever possible the same or similar reference numbers are used in the drawings and the description to refer to the same or like parts. It should be noted that the drawings are in simplified form and are not to precise scale. In reference to the disclosure herein for purposes of convenience and clarity only, directional terms, such as top, bottom, left, right, up, down, over, above, below, beneath, rear, front, vertical, horizontal, length, width, and height are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent of the following detailed description, although discussing exemplary embodiments, is to be construed to cover all modifications, alternatives, and equivalents of the embodiments as may fall within the spirit and scope of the invention as defined by the appended claims. It is to be understood and appreciated that the structures and methods described herein do not cover a complete assembly or process flow for the manufacture of chalcogenide phase change memories. The present invention may be practiced in conjunction with various fabrication techniques that are conventionally used in the art, and only so much of the commonly practiced process steps are included herein as are necessary to provide an understanding of the present invention.

Figure 2:
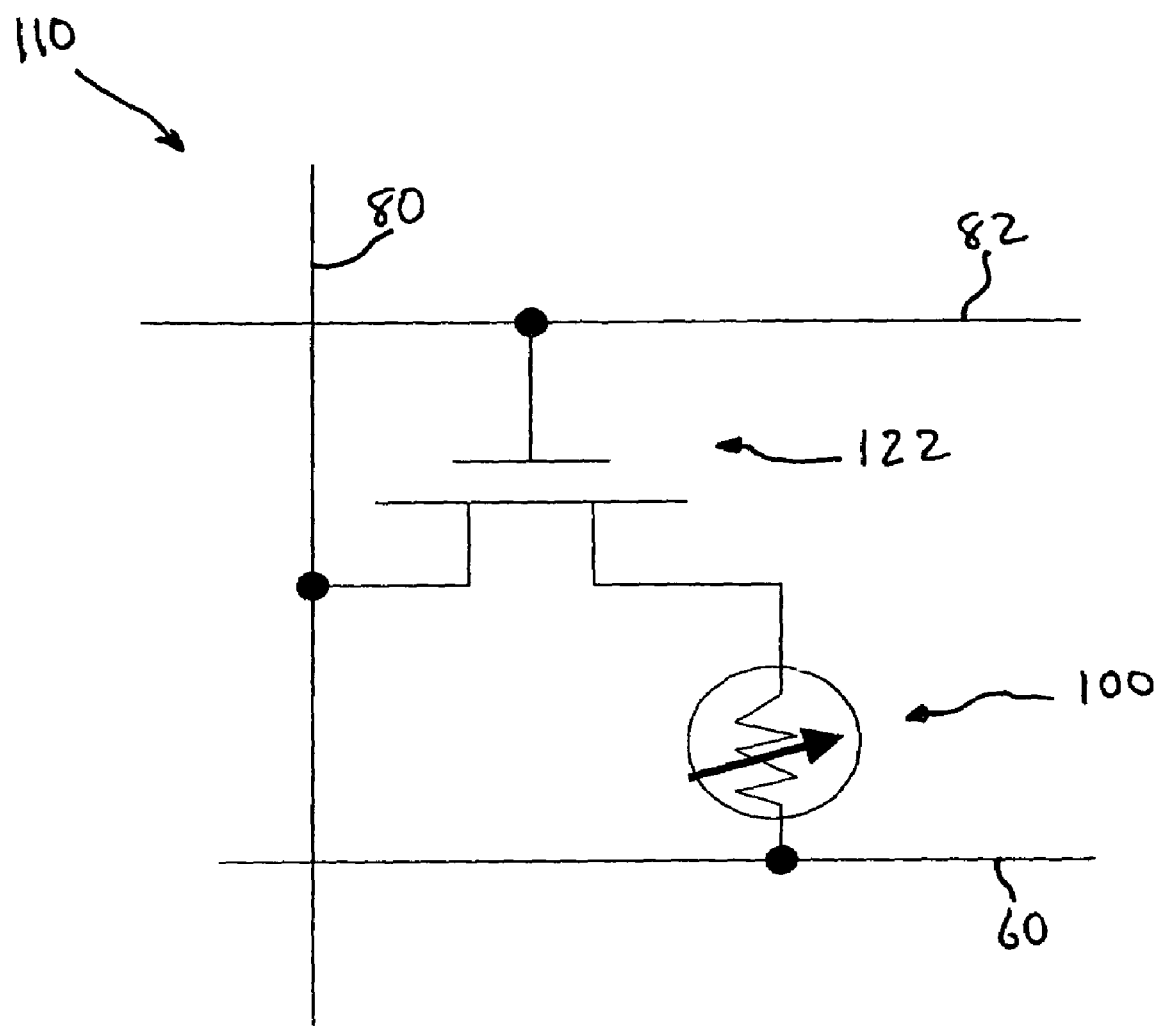
FIG. 2 is a schematic diagram of al memory cell pair in accordance with the present invention.

FIG. 1 shows a schematic diagram depicting a phase change memory cell array 120. Memory cell array 120 can be made up of several phase change memory units 110. While four memory units 110 are shown forming memory cell array 120, it is possible to make dense arrays of memory units 110 that include thousands or millions of individual memory units. An individual memory unit 110 is shown in FIG. 2.

Memory unit 110 can have a switch 122, a phase-change memory cell 100, a word line 82, a bit line 80 and a drive line 60. Switch 122 can be a transistor, which can control the current flowing to memory cell 100. Switch 122 is shown having a gate connected to word line 82, a source connected to bit line 80 and a drain connected to memory cell 100. Memory cell 100 thus can be connected between switch 122 and drive line 60. Drive line 60, bit line 80 and word line 82 can be used to access, store and retrieve data from memory cell 100. In the illustrated embodiment, a memory cell 100 can be disposed at the intersection of each drive line, bit line and word line.

Phase change memory cell 100 can be switched between two or more different states. Depending upon the amount of electrical energy that is passed through memory cell 100, it can be changed from an amorphous state to a crystalline state or to varying states in between. The memory cell thus changes conductivity or resistance based upon its crystal state.

Figure 3:
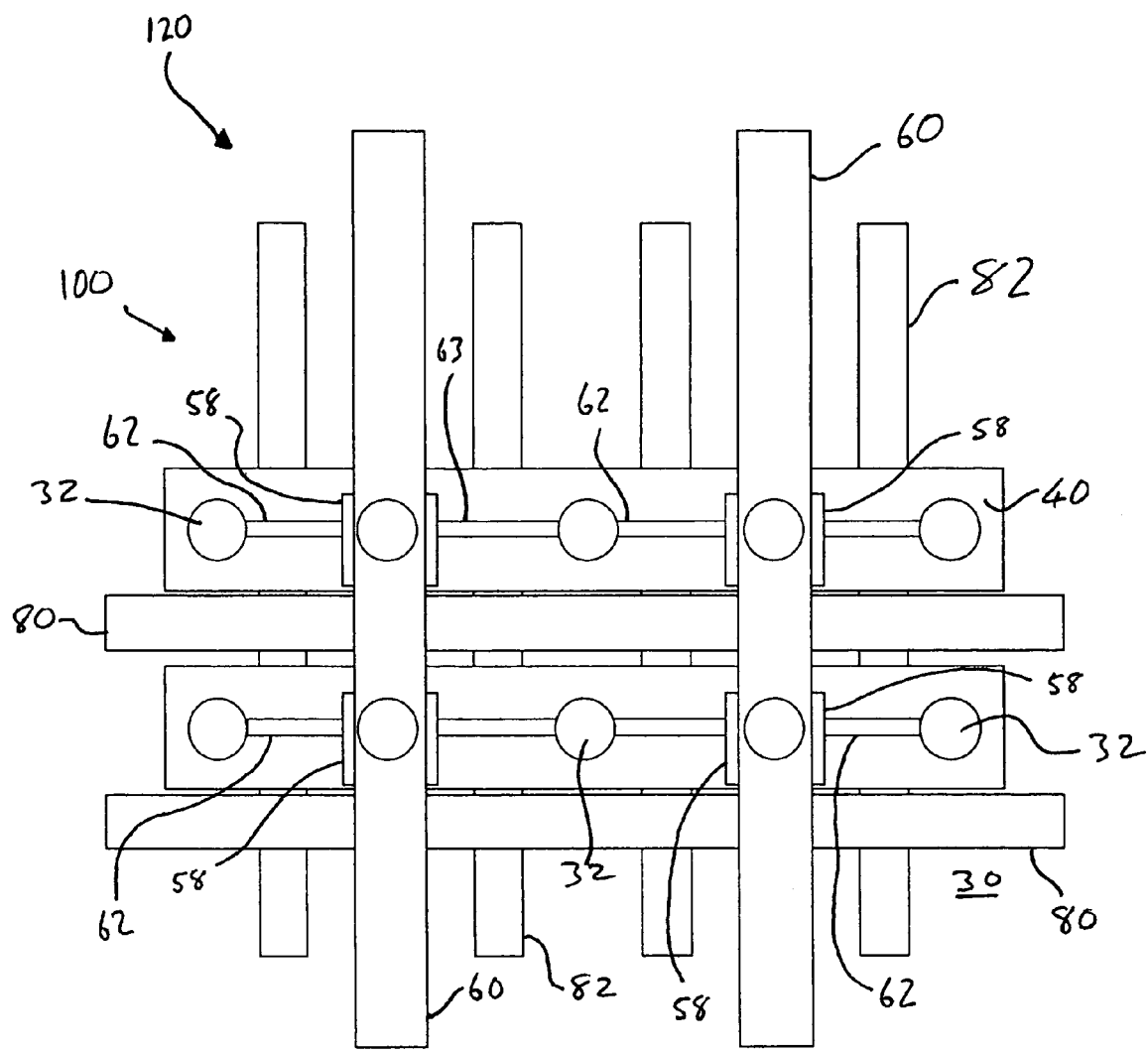
FIG. 3 illustrates a top view of a portion of a physical layout of a memory cell array.
Figure 4:
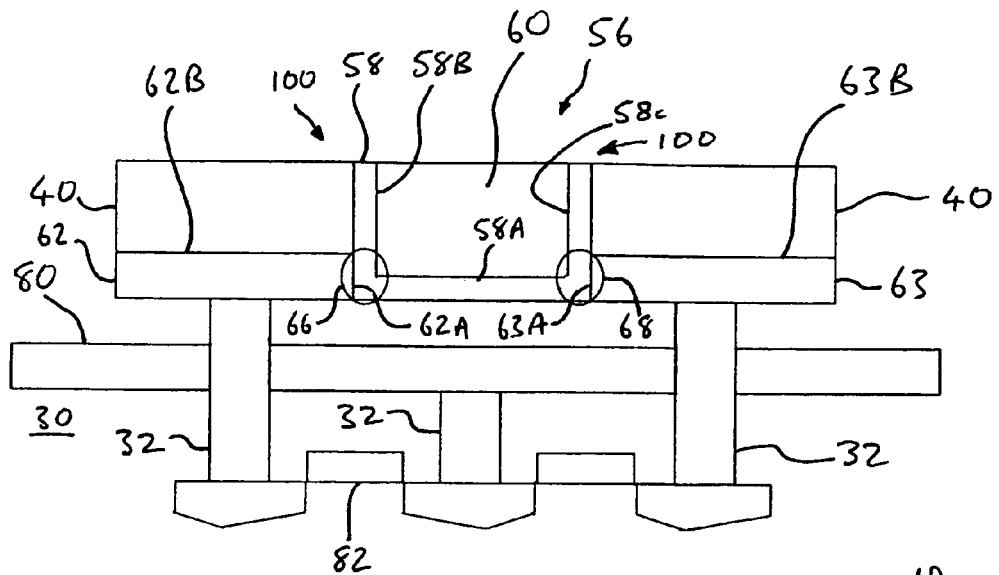
FIG. 4 is a cross-sectional view of a memory cell pair.

Referring to FIGS. 3 and 4, a top view of a portion of a physical layout of a memory cell array 120 is shown in FIG. 3, and FIG. 4 shows a cross-sectional view of a pair or structure of memory cells 100. A substrate 30 has several features patterned on and within the substrate. Substrate 30 can be any suitable substrate such as silicon or ceramic. Substrate 30 typically will contain other device structures such as transistors, diodes, resistors or other devices (not shown) in order for example to supply power to and address memory cells 100. Bit lines 80 and polysilicon word lines 82 are oriented orthogonally to each other within substrate 30, and drive lines 60 are parallel with word lines 82. Bit lines 80 and word lines 82 can be located on different levels or planes within substrate 30 and do not contact one anther at intersections thereof. Several tungsten via or tungsten plugs 32 extend through substrate 30. Tungsten plugs 32 can of course be electrically conductive. Bits lines 80, word lines 82 and tungsten plugs 32 can be formed using conventional semiconductor processing techniques. The word lines and bit lines, even though buried within substrate 30, are shown in FIG. 3 for better understanding of the present invention.

Memory cell 100 can have conductor lines or conductive wires 62 and 63 of titanium nitride (TiN) or titanium aluminum nitride (TiAlN) that can be located on the top of substrate 30. Conductive lines 62 and 63 have contact ends 62A and 63A (FIG. 4), respectively, that contact a layer 58 of phase change material or memory material, such as chalcogenide, and have other ends 62B and 63B that are electrically connected to respective tungsten plugs 32. An insulating layer 40 of, for example, silicon dioxide (SiO2) can cover conductive lines 62 and 63 and a portion of substrate 30.

An aperture 56 can be located in layer 40, and in the illustrated embodiment aperture 56 can extend down toward the substrate 30. In the illustrated embodiment, the aperture 56 extends all of the way down to the substrate. The layer 58 of memory material can partially fill aperture 56. As presently embodied, memory material layer 58 conforms to the dimensions of aperture 56. Memory material layer 58 has a bottom surface 58A and memory layer side walls 58B and 58C.

In a preferred embodiment, memory material layer 58 can be made from chalcogenide. Typical chalcogenide compositions for memory cells include 48% to 63% tellurium (Te), 17% to 26% germanium (Ge) and 11% to 35% antimony (Sb). The percentages are atomic percentages which total 100% of the atoms of the constituent elements. In a preferred embodiment, the chalcogenide composition for the memory material can be, 56% Te, 22% Ge and 22% Sb. Contact end 62A of conductive line 62 is in electrical contact with a portion of memory layer side wall 58B, and contact end 63A of conductive line 63 is in electrical contact with a portion of memory layer side wall 58C. A metal drive line or conductive layer 60 can be disposed over memory material 58 in aperture 56. As presently embodied, drive line 60 fills the remainder of aperture 56 up to a level flush with the top of insulating layer 40. Tungsten plugs 32 provide electrical connections between the memory material 58 and word lines 80 and bit lines 82.

Figure 5:
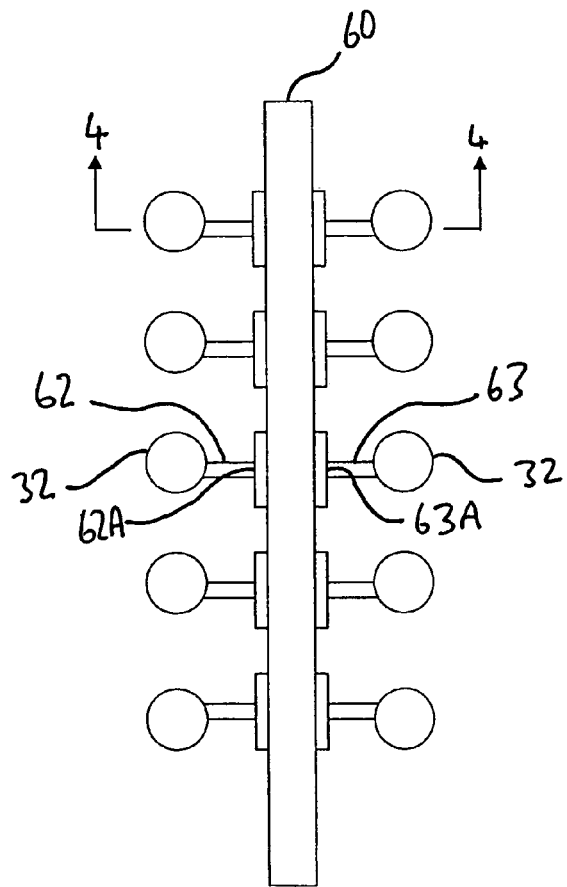
FIG. 5 is a top view of a portion of a memory array with the silicon dioxide insulating layer removed.

An active region 66 can be defined in memory layer side wall 58B between contact end 62A and conductive layer 60. Similarly, an active region 68 can be defined in memory layer side wall 58C between contact end 63A and conductive layer 60. Active regions 66 and 68 can be uniform and very small as a result of the contact ends 62A and 63A being defined by the cross-sectional areas of conductive lines 62 and 63. The height of each active region 66, 68 can thus be controlled by a corresponding thickness of the conductive lines 62 and 63, and the width of each active region can be controlled by a corresponding width of a spacer 44 (FIG. 13, infra) and the limits of the photolithographic imaging and etching processes. FIG. 5 shows a top view of a portion of memory cell array 120 with the silicon dioxide insulating layer removed.

Although memory arrays 120 are shown with a small number of memory cells 100, it is possible to make dense arrays of memory cells 100 that include thousands or millions of individual memory units. The present invention may have multiple advantages over typical prior-art structures. Memory cells 100 can be used to fabricate a high density chalcogenide memory array with millions of individual memory cells. Since, the active regions 66 and 68 are relatively small, memory cells 100 may have reduced power requirements for switching between different states.

The present invention provides a design and method for fabricating chalcogenide memory cells with relatively small device features that can be below the limits of current photolithography processes. Since conductive lines 62 and 63 can be deposited in very thin layers, the thickness of these lines can be used to control one of the dimensions of the active region. Since only the contact ends of conductive lines 62 and 63 touch the active region, another dimension of the active regions can be readily controlled. In contrast, typical prior art methods of forming a contact may rely on the photolithographic limits of imaging a pore or hole and having to simultaneously control both the width and the length of the contact. The present invention may allow for easier fabrication with improved yields.

Figure 6:
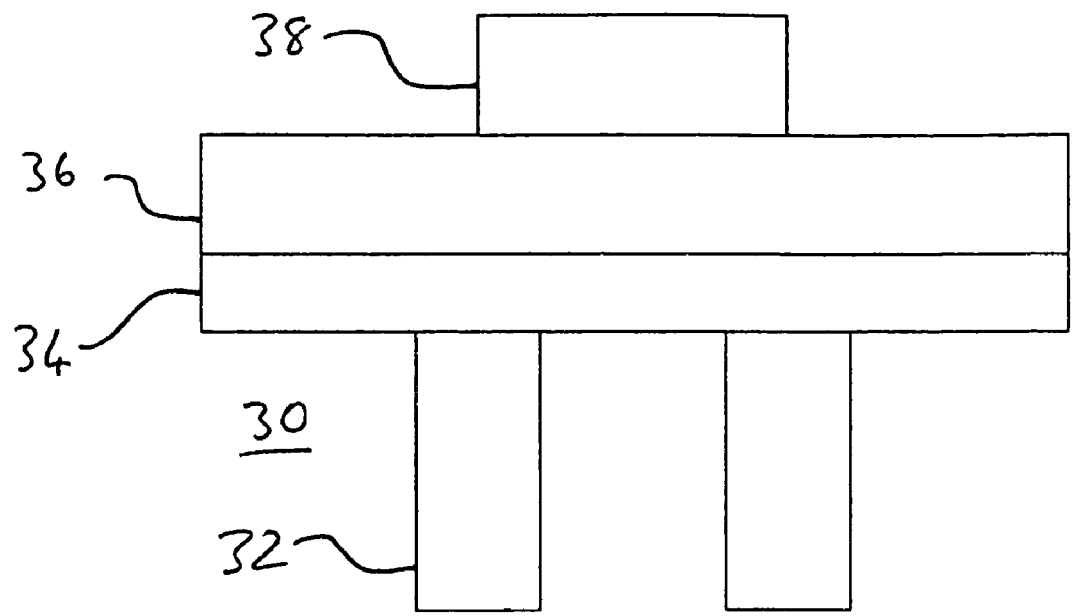
FIG. 6 is a partial cross-sectional view showing photolithography of the titanium nitride and silicon nitride layers.

Accordingly, the present invention provides a method of making small contact features which can have sizes below the limits of current photolithography processes. Referring to FIGS. 6–26, a method of fabricating chalcogenide memory cells with relatively small active regions will now be described. Memory cells 100 can be fabricated using conventional semi-conductor processing methods and techniques. A conductive layer 34 of titanium nitride or titanium aluminum nitride can be deposited onto a substrate 30 using conventional thin film deposition techniques as shown in FIG. 6. Substrate 30 can be any suitable substrate such as silicon or ceramic. Substrate 30 can contain other device structures such as transistors, diodes, resistors or other devices. In accordance with typical embodiments layer 34 can have a substantially uniform thickness from about 50 to 500 Angstroms, and in an exemplary embodiment can have a thickness of about 100 Angstroms. An insulating layer 36 of, for example, silicon nitride (SiN) can be deposited over layer 34 using conventional thin film deposition techniques. Layer 36 can have a substantially uniform thickness from about 1000 to 3000 Angstroms in typical embodiments and of about 2000 Angstroms in an exemplary embodiment. Layers 34 and 36 can be deposited using, for example, sputtering and chemical vapor deposition (CVD) techniques, respectively.

Several via extend within substrate 30. In the illustrated embodiment, the via are filled with tungsten to form tungsten plugs 32 which are electrically conductive. Tungsten plugs 32 are used to establish electrical connections to layer 34. In modified embodiments, the via may be filled with materials other than or in addition to tungsten. A layer 38 of photoresist can then be formed and patterned over layer 36. Photoresist layer 38 can be deposited and patterned using conventional photolithography techniques.

Figure 7:
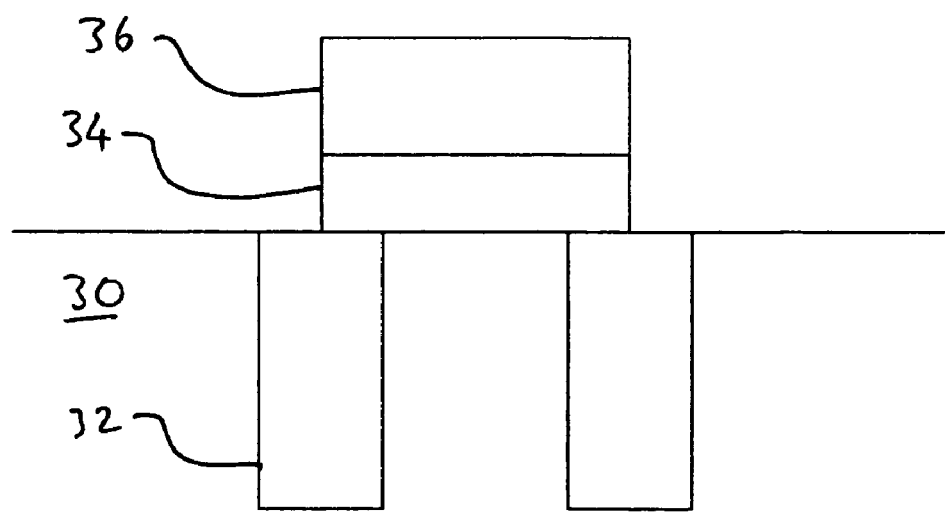
FIG. 7 is a partial cross-sectional view showing the titanium nitride and silicon nitride layers of FIG. 6 after etching.

Layers 34 and 36 can then be etched to form a pattern using conventional etching techniques as shown in FIG. 7.

Figure 8:
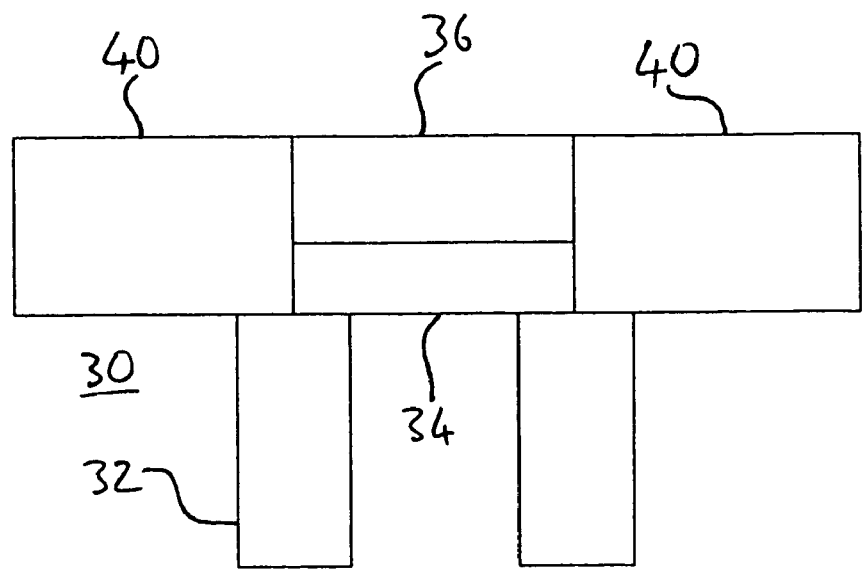
FIG. 8 is a partial cross-sectional view showing formation of a layer of silicon dioxide.

For example, an anisotropic etch process may be performed wherein a first etch is conducted with an etchant having a greater selectivity for the layer 36 than for layer 34 and a second etch is conducted using an etchant with a greater selectivity for the layer 34 than for the substrate 30 and tungsten plugs 32. After etching, remaining portions of layers 34 and 36 are disposed above and between tungsten plugs 32. FIG. 8 is a partial cross-sectional view showing formation of a layer of silicon dioxide 40 The layer of silicon dioxide 40 can be deposited using known techniques and planarized or etched back to expose an upper surface of layer 36.

Figure 9:
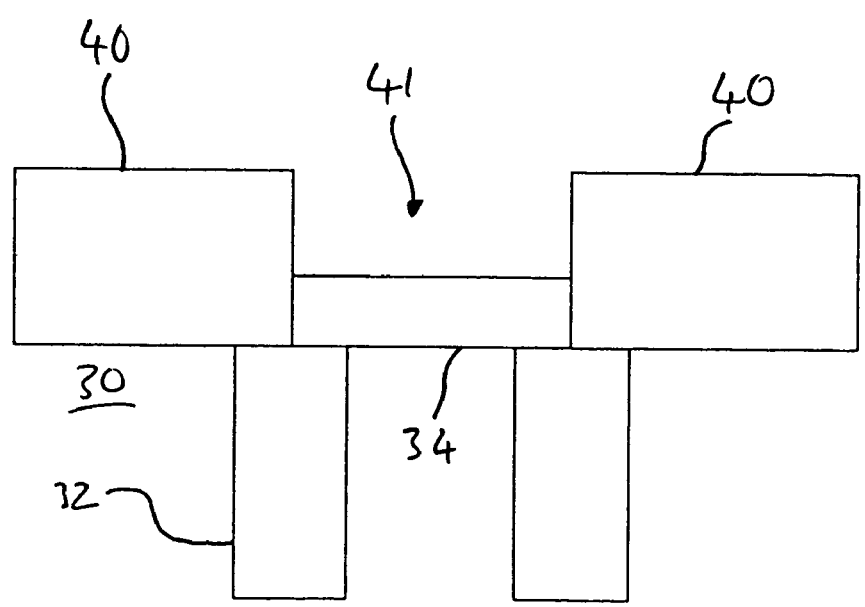
FIG. 9 is a partial cross-sectional view showing removal of the silicon nitride layer.
Figure 10:
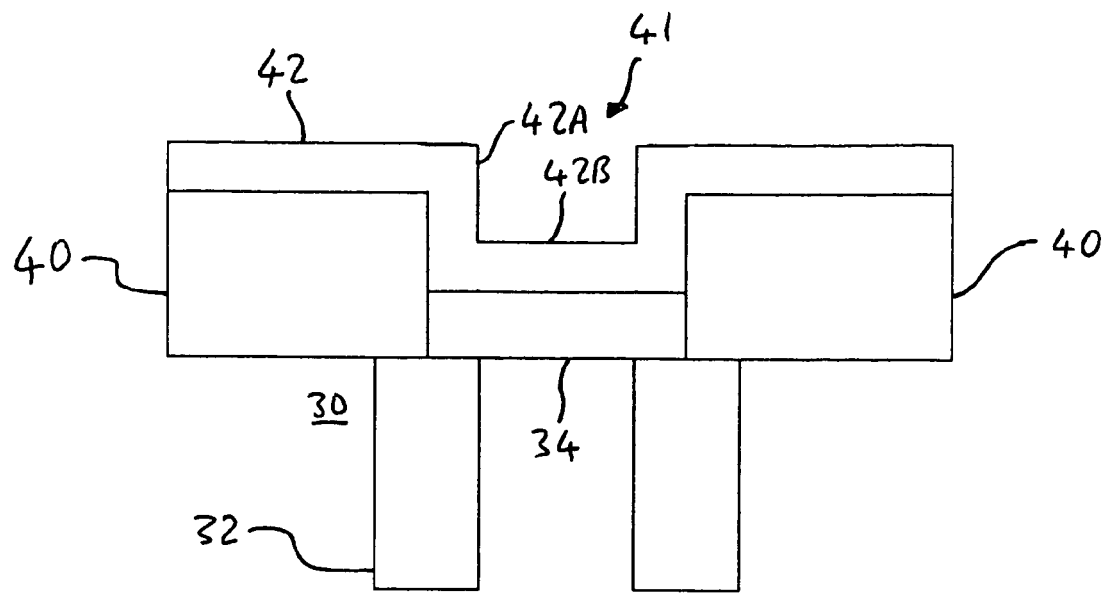
FIG. 10 is a partial cross-sectional view showing formation of another layer of silicon nitride.

Next, silicon nitride layer 36 can be etched using conventional etching techniques to form a window 41 as shown in FIG. 9. For example, an anisotropic etch process may be conducted with an etchant having a greater selectivity for the layer 36 than for the layer 40. Window 41 can have typical dimensions from about 0.05 μm to 0.2 μm, and in an exemplary embodiment can have a dimension of about 0.1 μm. A layer 42 of silicon nitride can then be deposited over layer 40 and into window 41 using conventional thin film deposition techniques to generate the structure shown in FIG. 10. The portion of layer 42 positioned within widow 41 includes vertical side wall portions 42A and a horizontal bottom portion 42B. In the illustrated embodiment, layer 42 is conformal to the underlying layers. In typical embodiments layer 42 can have a substantially uniform thickness ranging from about 50 to 200 Angstroms, and in an exemplary embodiment can have a thickness of about 100 Angstroms.

Figure 11:
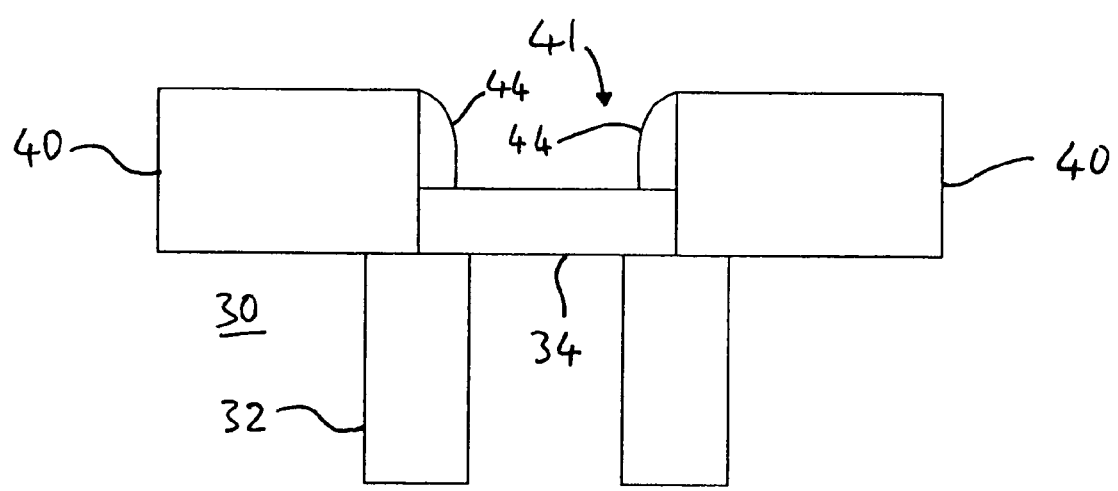
FIG. 11 is a partial cross-sectional view showing formation of spacers.

Layer 42 can then be etched using conventional etching techniques to form spacers 44 from layer 42 as shown in FIG. 11. For example, an anisotropic etch process may be conducted with an etchant having a greater selectivity for the layer 42 than for the layers 34 and 40. The etching removes the portion of layer 42 over layer 40, bottom portion 42B and a part of side walls 42A. Spacers 44 are located within window 41 adjacent to layer 40 and above layer 34.

Figure 12:
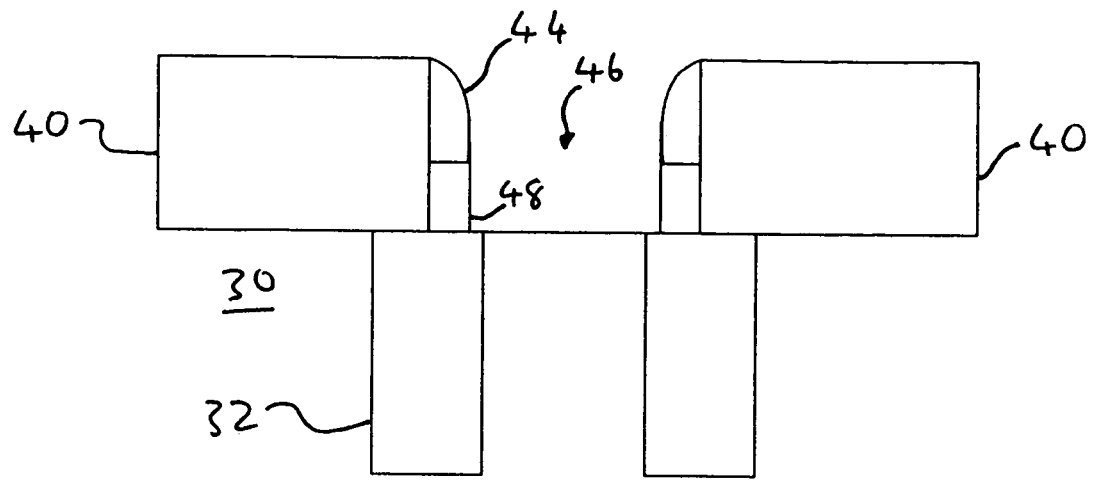
FIG. 12 is a partial cross-sectional view showing etching of the titanium nitride layer to form a cavity.

Referring to FIG. 12, the portion of layer 34 not covered by spacers 44 can then be etched using conventional etching techniques to form a groove 46 in layer 34 that extends down to substrate 30. For example, an anisotropic etch process may be conducted with an etchant having a greater selectivity for the layer 34 than for, e.g., the layers 40 and 44. The etching of layer 34 also forms conductive lines or wires 48. Groove 46 can have a typical dimension from about 300 to 1800 Angstroms, and in an exemplary embodiment can have a dimension of about 800 Angstroms.

In accordance with an aspect of the present invention and as discussed above in connection with FIG. 4, the cross-sectional area of each conductive line 48 will determine the area of a corresponding active region (e.g., active regions 66, 68 of FIG. 4). The cross-sectional area of each conductive line 48 can be determined by the thin film thickness of layer 34 of FIG. 6 and/or its after-etch thickness in FIG. 9, and by the width of spacer 44 (which is determined, e.g., by the thin film thickness of layer 42 of FIG. 10 and/or its after-etch thickness in FIG. 11). In typical embodiments, each conductive line 48 can have a width of about 50 to 200 Angstroms and a height of about 50 to 200 Angstroms, and in an exemplary embodiment can have a width of about 100 Angstroms and a height of about 100 Angstroms.

Figure 13:
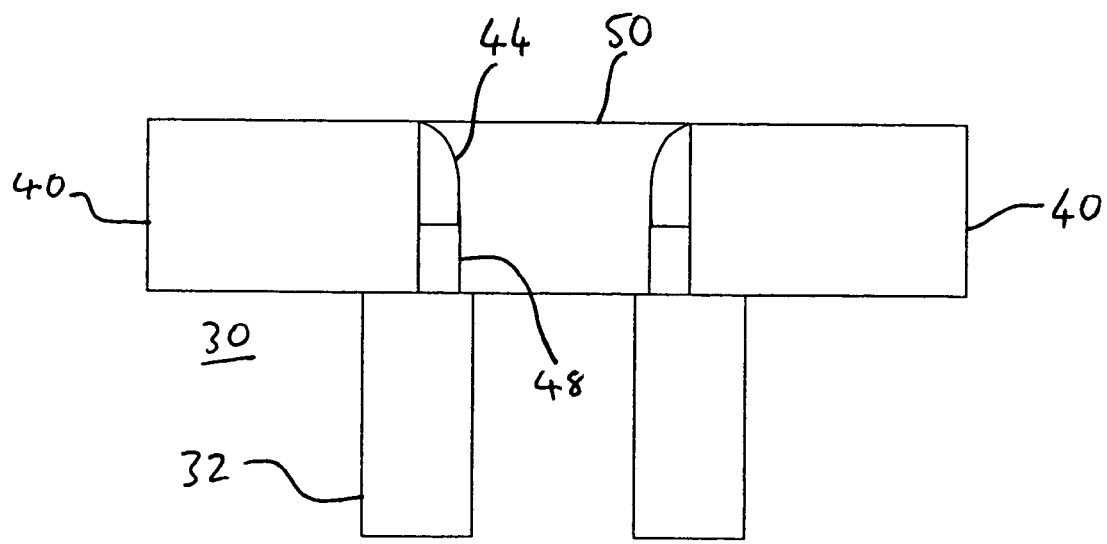
FIG. 13 is a partial cross-sectional view showing the deposition of silicon dioxide into the cavity of FIG. 12.
Figure 14:
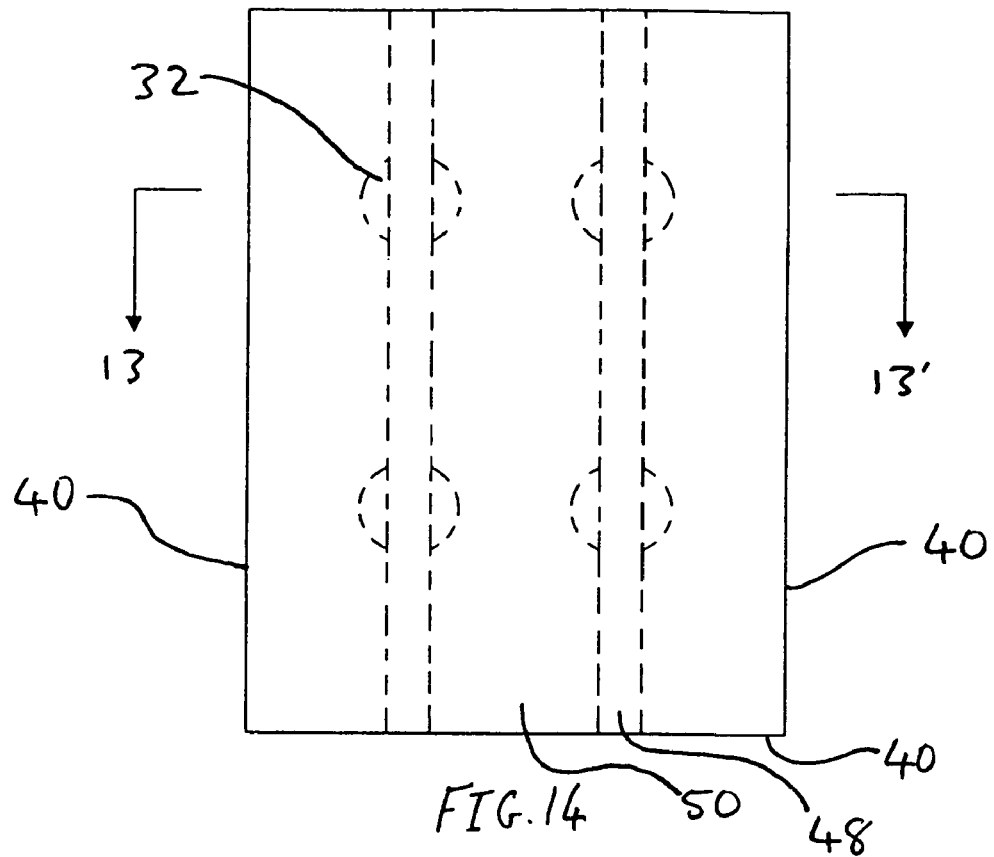
FIG. 14 is a partial top view of FIG. 13.

The spacers 44 may then optionally be removed in some embodiments using conventional etching techniques, but in the embodiment of FIGS. 13 and 14 the spacers are kept. Spacers 44 thus can provide a technique for defining a very small groove 46 in layer 34 and in the illustrated embodiment for providing even smaller conductive lines 48.

A layer 50 of silicon dioxide can then be deposited over groove 46 and layer 40 using conventional thin film deposition techniques. Layer 50 can be chemical mechanical planarized (CMP) or etched back to for example expose the layer 40 resulting in the structure shown in FIG. 13. In the illustrated embodiment of FIG. 13, it can be seen that the top of silicon dioxide layer 50 filling groove 46 is level with silicon dioxide layer 40. Silicon dioxide layer 50 may have a substantially uniform thicknesses ranging from about 1000 to 3000 Angstroms, and in an exemplary embodiment can have a thickness of about 2000 Angstroms. FIG. 14 shows a top view of FIG. 13 after the layer 50 has been formed. The line 13–13' of FIG. 14 corresponds to the cross-sectional view of FIG. 13. For clarity, in the present and following figures, the underlying hidden structures such as tungsten plugs 32, spacers 44 and/or conductive lines 48 under the silicon dioxide layers 40 and 50 are shown in phantom.

Figure 15:
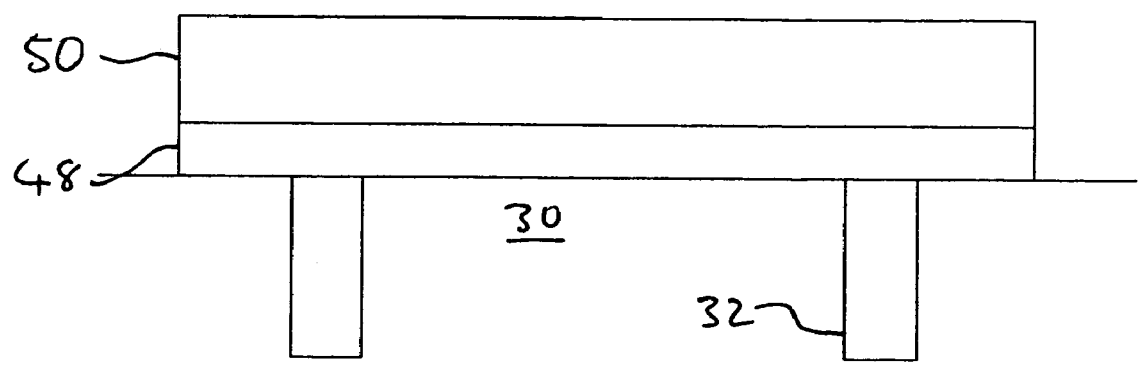
FIG. 15 is a partial cross-sectional view, taken along line 15–15' of FIG. 16, showing the titanium nitride and silicon nitride layers.
Figure 16:
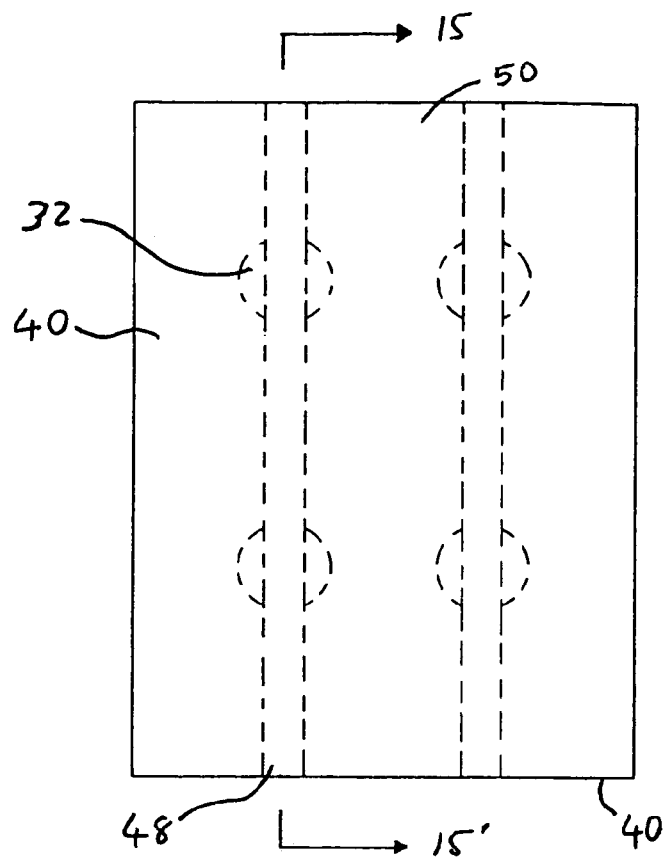
FIG. 16 corresponds to FIG. 14 and is a partial top view of FIG. 15.

Turning to FIGS. 15 and 16, additional views of the structure of FIGS. 13 and 14 are provided. FIG. 16 (similar to FIG. 14) shows a reference line 15–15' from which the cross-sectional view of FIG. 15 is taken. The cross-sectional view of FIG. 15 is oriented orthogonal or 90 degrees to that of FIG. 13. In FIG. 15 and those that follow, contrary to the embodiment of FIGS. 13 and 14, spacers 44 have been removed (an optional step) so that silicon dioxide layer 40 covers conductive lines 48.

Figure 17:
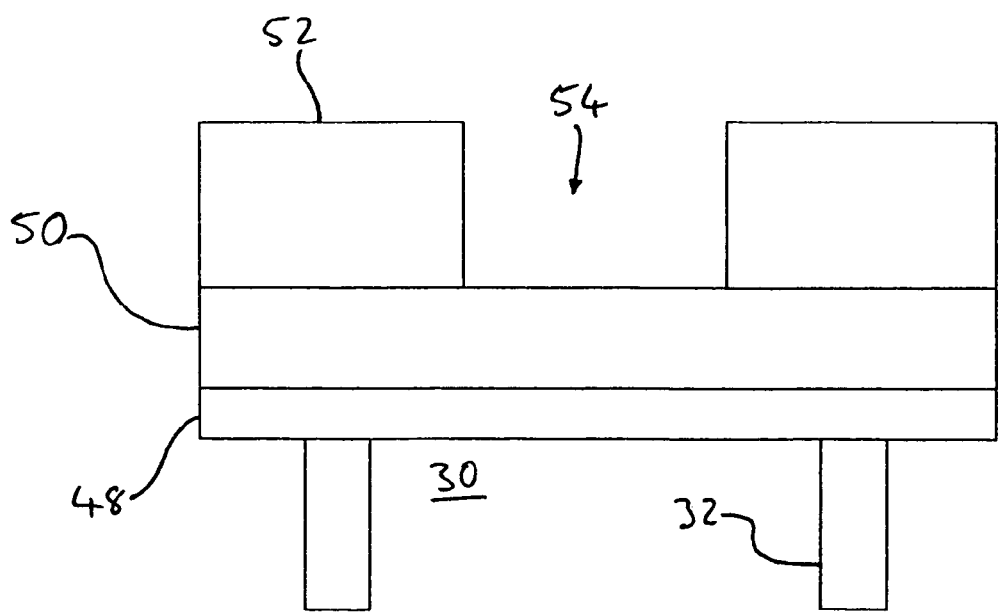
FIG. 17 is a partial cross-sectional view, taken along line 17–17' of FIG. 18, showing photolithography of the titanium nitride and silicon nitride layers of FIG. 16.
Figure 18:
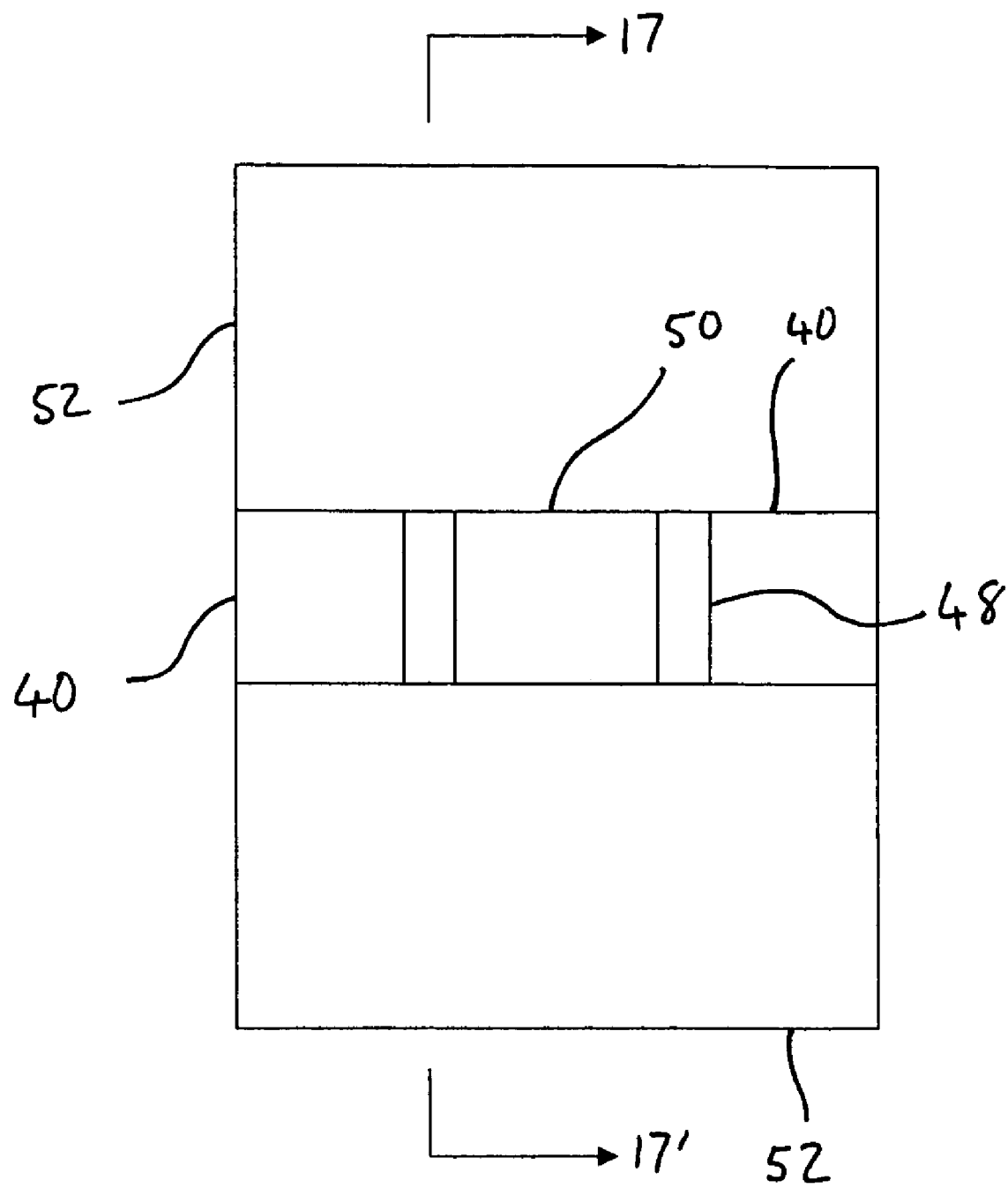
FIG. 18 is a partial top view of FIG. 17.

A layer 52 of photoresist can be applied and patterned over silicon dioxide layers 40 and 50 as shown in FIGS. 17 and 18, wherein the line 17–17' of FIG. 18 corresponds to the cross-sectional view of FIG. 17. Photoresist layer 52 can be deposited and patterned using conventional photolithography techniques to form an opening 54.

Figure 19:
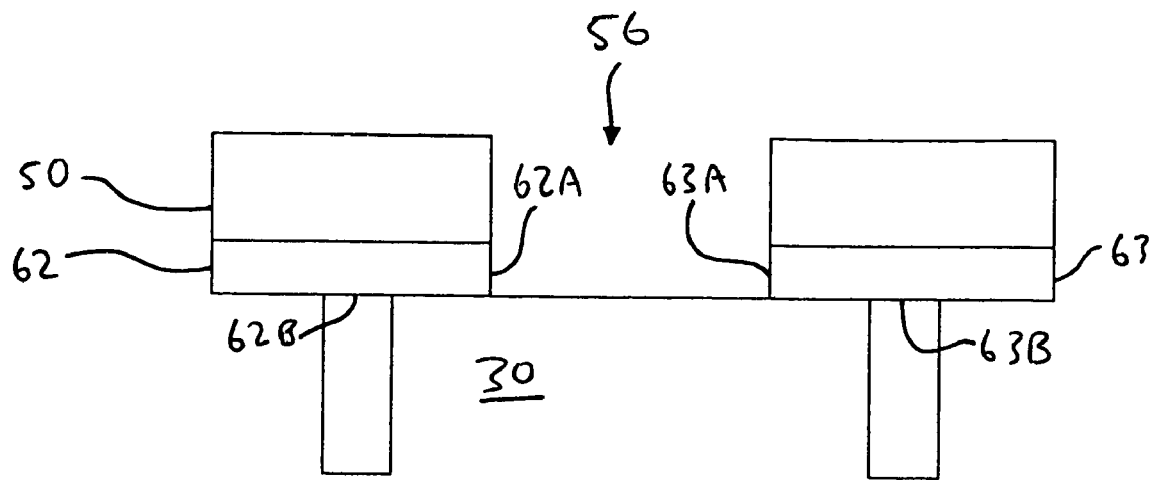
FIG. 19 is a partial cross-sectional view, taken along line 19–19' of FIG. 20, showing etching of the titanium nitride and silicon nitride layers to form an aperture.
Figure 20:
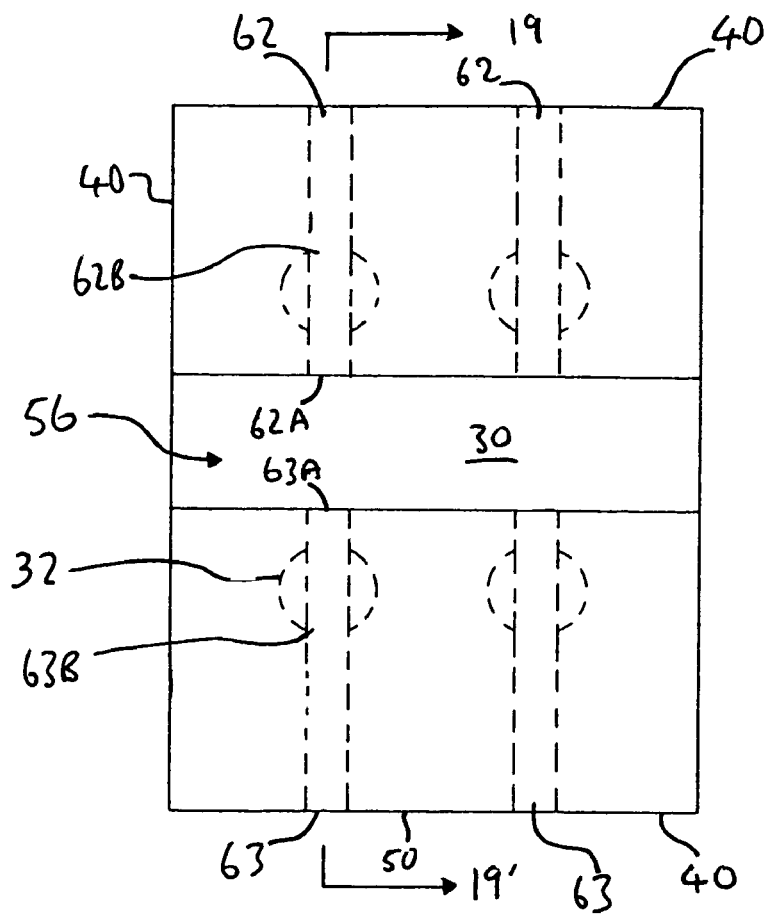
FIG. 20 is a partial top view of FIG. 19.

Next, layers 40, 50 and conductive lines 48 can be etched and the structure rinsed using conventional anisotropic etching techniques to yield the configuration shown in FIGS. 19 and 20, wherein line 19–19' of FIG. 20 corresponds to the cross-sectional view of FIG. 19. After etching, an aperture 56 is formed in layers 40, 50 and conductive lines 48, wherein the aperture 56 extends down to the substrate 30. Aperture 56 can have typical dimensions from about 0.05 μm to 0.2 μm and in an exemplary embodiment can have a dimension of about 0.1 μm. Also, after etching, each conductive line 48 is formed into two conductive lines or wires 62 and 63. Conductive line 62 has a contact or electrode end 62A and another end 62B in electrical contact with one of the tungsten plugs 32. Conductive line 63 has a contact or electrode end 63A and another end 63B in electrical contact with one of the tungsten plugs 32.

Figure 21:
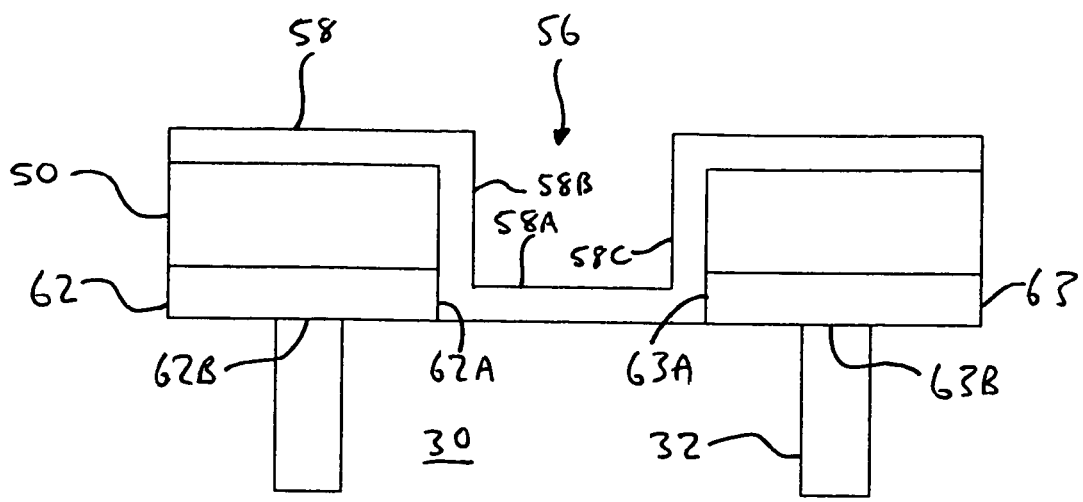
FIG. 21 is a partial cross-sectional view, taken along line 21–21' of FIG. 22, showing deposition of a memory layer.
Figure 22:
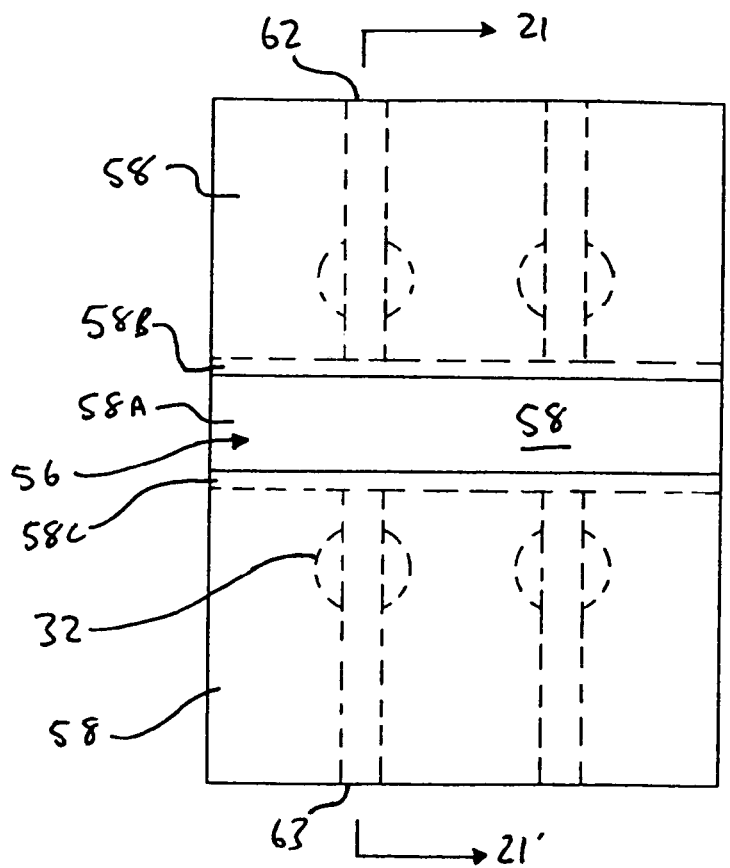
FIG. 22 is a partial top view of FIG. 21.

As shown in FIGS. 21 and 22, wherein the line 21–21' of FIG. 22 corresponds to the cross-sectional view of FIG. 21, a layer 58 of phase change material or memory material such as chalcogenide is then deposited into aperture 56 and over silicon dioxide insulating layers 40 and 50. As presently embodied, memory material layer 58 conforms to the shape of aperture 56. Memory material layer 58 has a bottom surface 58A and side walls 58B and 58C. Memory material layer 58 can be deposited using conventional thin film deposition techniques. In typical embodiments memory material layer 58 may have a substantially uniform thickness of about 50 to 500 Angstroms, and in an exemplary embodiment can have a thickness of about 100 Angstroms.

Figure 23:
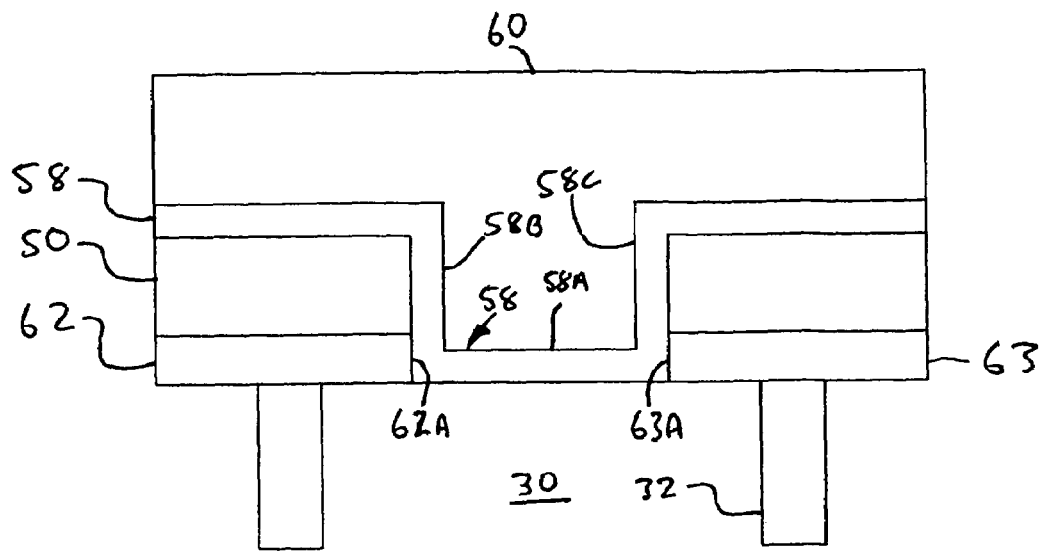
FIG. 23 is a partial cross-sectional view, taken along line 23–23' of FIG. 24, showing deposition of the conductive layer.
Figure 24:
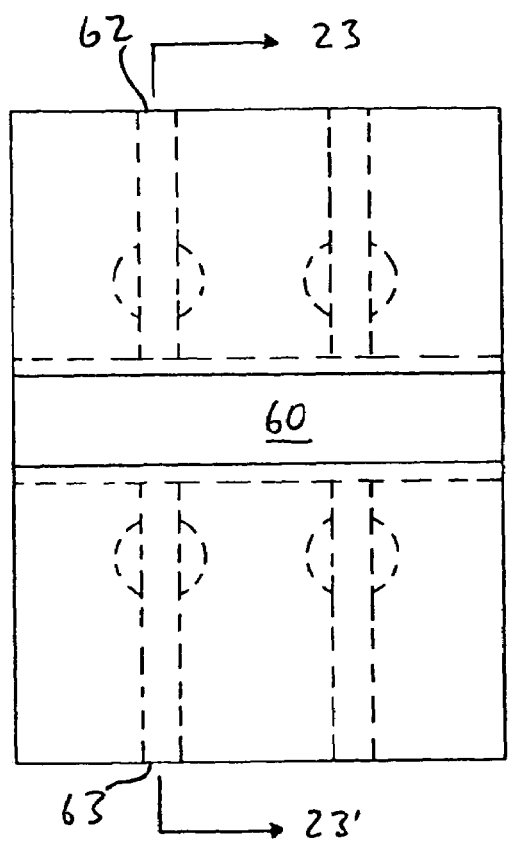
FIG. 24 is a partial top view of FIG. 23.

With reference to FIGS. 23 and 24, FIG. 23 is a cross-sectional view taken along line 23–23' of FIG. 24. In these figures a metal or conductive layer 60 has been deposited over memory material layer 58. Conductive layer 60 extends over memory material layer 58 and fills the remainder of aperture 56. Conductive layer 60 can be formed for example of Aluminum, Tungsten or Copper, and can be deposited using conventional thin film deposition techniques. Conductive layer 60 may have a substantially uniform thickness from about 1000 to 5000 Angstroms in typical embodiments, and may have a thickness of about 3000 Angstroms in an exemplary embodiment.

Figure 25:
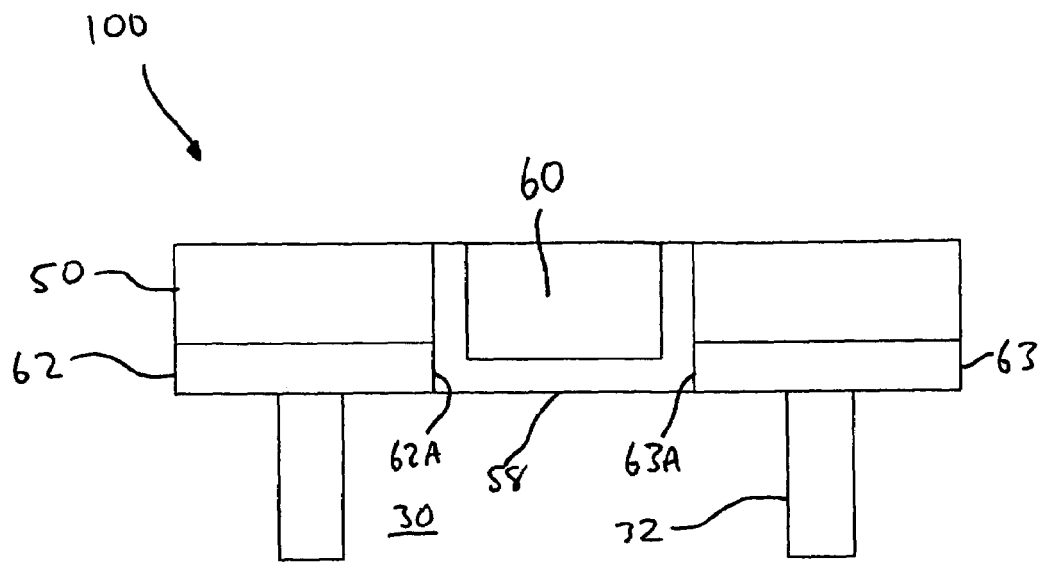
FIG. 25 is a partial cross-sectional view, taken along line 25–25' of FIG. 26, showing the completed memory cells.
Figure 26:
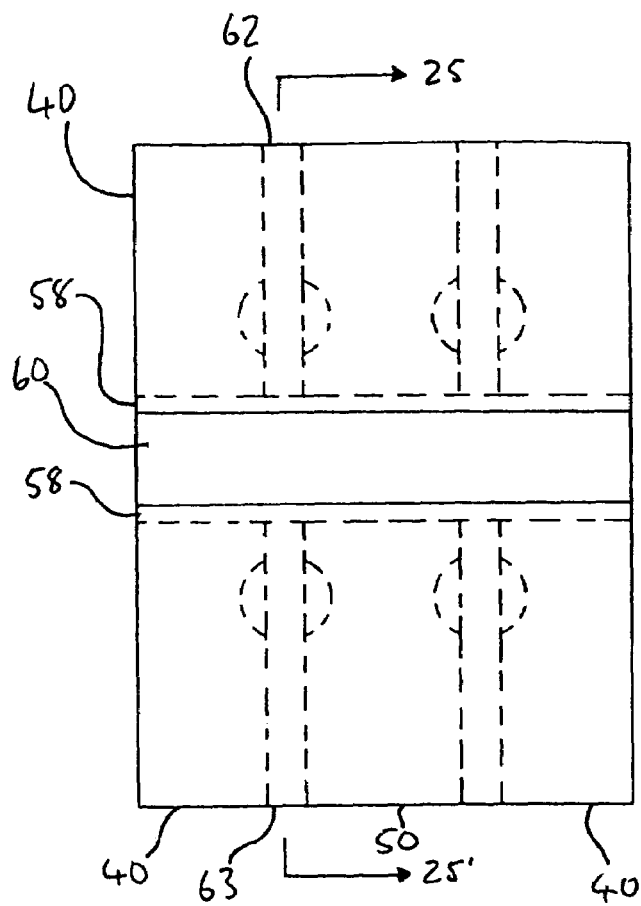
FIG. 26 is a partial top view of FIG. 25.

Memory material layer 58 and conductive layer 60 may then be planarized or etched back to expose layers 40 and 50, resulting in the structure shown in FIGS. 25 and 26. In FIG. 25, which is a cross-sectional view taken along line 25-25' of FIG. 26, the tops of memory material layer 58 and conductive layer 60 are level or flush with silicon dioxide layers 40 and 50. A resulting structure corresponding to that of FIGS. 3 and 4 is thus formed.

In view of the foregoing, it will be understood by those skilled in the art that the designs and methods of the present invention can facilitate the formation of phase change memory cells in non-volatile random access memory devices. The present invention can improve for example the storage life of magnetic memory cells. The aforementioned embodiments have been provided by way of example, and the present invention is not limited to these examples. Multiple variations and modification to the disclosed embodiments will occur, to the extent not mutually exclusive to those skilled in the art upon consideration of the foregoing description. Additionally, other combinations, omissions, substitutions and modifications will be apparent to the skilled artisan in view of the disclosure herein. Accordingly, the present invention is not limited by the disclosed embodiments, but is to be defined by reference to the appended claims.

What is claimed is:

1. A memory cell structure comprising:
    a substrate;
    first and second via extending within the substrate;
    an insulating layer disposed over the substrate;
    an aperture formed in the insulating layer,
    a memory layer formed in the aperture, the memory layer having a bottom surface and first and second side walls;
    first and second conductive lines located between the insulating layer and the substrate,
    the conductive lines being connected between the memory layer and the via; and
    a conductive layer located over the memory layer within the aperture.

2. The memory cell structure as set forth in claim 1, wherein the first conductive line is connected between The first via and the first side wall and the second conductive line is connected between the second via and the second side wall.

3. The memory cell structure as set forth in claim 1, wherein a first active region is a portion of the first side wall and a second active region is a portion of the second side wall.

4. The memory cell structure as set forth in claim 3, wherein a current passing through one of the first and the second active regions causes a change from a first state to a second state.

5. The memory cell structure as set forth in claim 1, wherein the memory layer is chalcogenide.

6. The memory cell structure as set forth in claim 1, wherein the conductive layer forms a drive line.

7. The memory cell structure as set forth in claim 1, wherein spacers are used to define the conductive lines.

8. The memory cell structure as set forth in claim 1, further comprising:
    a bit line;
    a word line;
    a switch connected to the word line and the bit line, wherein the memory cell is connected between the drive line and the switch.

9. The memory cell structure as set forth in claim 1, wherein the bottom surface of the memory layer contacts the substrate.

10. A memory cell structure, comprising:
    a substrate;
    first and second conductor lines disposed on the substrate, each of the conductor lines having a first end and a second end;
    an insulating layer disposed over the substrate and conductor lines;
    an aperture formed in the insulating layer;
    a phase change layer positioned within the aperture and in contact with the first ends;
    first and second via extending within the substrate and connected to the second ends; and
    a conductive layer covering the phase change layer and filling the aperture.

11. The memory cell structure as set forth in claim 10, wherein the aperture is formed by the steps of:
    depositing a first layer over a first conductive layer on the substrate;
    depositing a first photoresist over a portion of the first layer;
    etching the first layer and the first conductive layer to form a pattern;
    removing the photoresist;
    depositing the insulating layer around the pattern;
    removing the first layer,
    depositing a second layer over the first conductive layer and the insulating layer,
    removing a portion of the second layer to form at least one spacer,
    etching the first conductive layer to form a hole;
    depositing a second photoresist over a portion of the insulating layer; and
    etching the insulating layer and the first conductive layer to form the aperture.

12. The memory cell structure as set forth in claim 11, wherein the depositing of a second photoresist is preceded by removing the at least one spacer.

13. The memory cell structure as set forth in claim 11, wherein the memory cell is formed by the steps of:
    depositing the phase change layer over the insulating layer and within the aperture;
    removing the phase change layer above the insulating layer; and
    depositing the conductive layer within the aperture over the phase change layer.

14. The memory cell structure as set forth in claim 10, wherein the conductive layer forms a drive line.

15. The memory cell structure as set forth in claim 10, wherein active regions are located in the phase change layer between the first ends and the conductive layer.

* * * * *